United States Patent [19]
Asazawa

[11] Patent Number: 5,917,377
[45] Date of Patent: Jun. 29, 1999

[54] DIFFERENTIAL AMPLIFIER CIRCUIT

[75] Inventor: Hiroshi Asazawa, Tokyo, Japan

[73] Assignee: NEC Corporation, Japan

[21] Appl. No.: 09/065,856

[22] Filed: Apr. 24, 1998

[30] Foreign Application Priority Data

Apr. 25, 1997 [JP] Japan .................................. 9-122987

[51] Int. Cl.⁶ ...................................................... H03F 3/45
[52] U.S. Cl. ............................................. 330/252; 330/260
[58] Field of Search ..................................... 330/252, 300, 330/295, 286, 259, 260, 292

[56] References Cited

U.S. PATENT DOCUMENTS

| | | | |
|---|---|---|---|
| 3,843,934 | 10/1974 | Giles | 330/30 D |
| 4,904,952 | 2/1990 | Tanimoto | 330/252 |
| 5,227,681 | 7/1993 | Koyama et al. | 330/300 |
| 5,345,346 | 9/1994 | Brannon et al. | 330/260 |

*Primary Examiner*—Robert Pascal
*Assistant Examiner*—Patricia Nguyen
*Attorney, Agent, or Firm*—Ostrolenk, Faber, Gerb & Soffen, LLP

[57] ABSTRACT

A differential amplifier circuit which enables oscillation of pre-scaler to prevent at the time no-signal causes sensitivity not to deteriorate to an AC signal itself. The differential amplifier circuit comprises a first pair of differential device consisting of transistors to which AC signal is inputted, load resistances, and a constant-current source, a second pair of differential device which is connected so as to perform positive feedback from terminals in between both ends of load resistances, and a capacitor for performing by-pass of AC signal of the terminals.

9 Claims, 6 Drawing Sheets

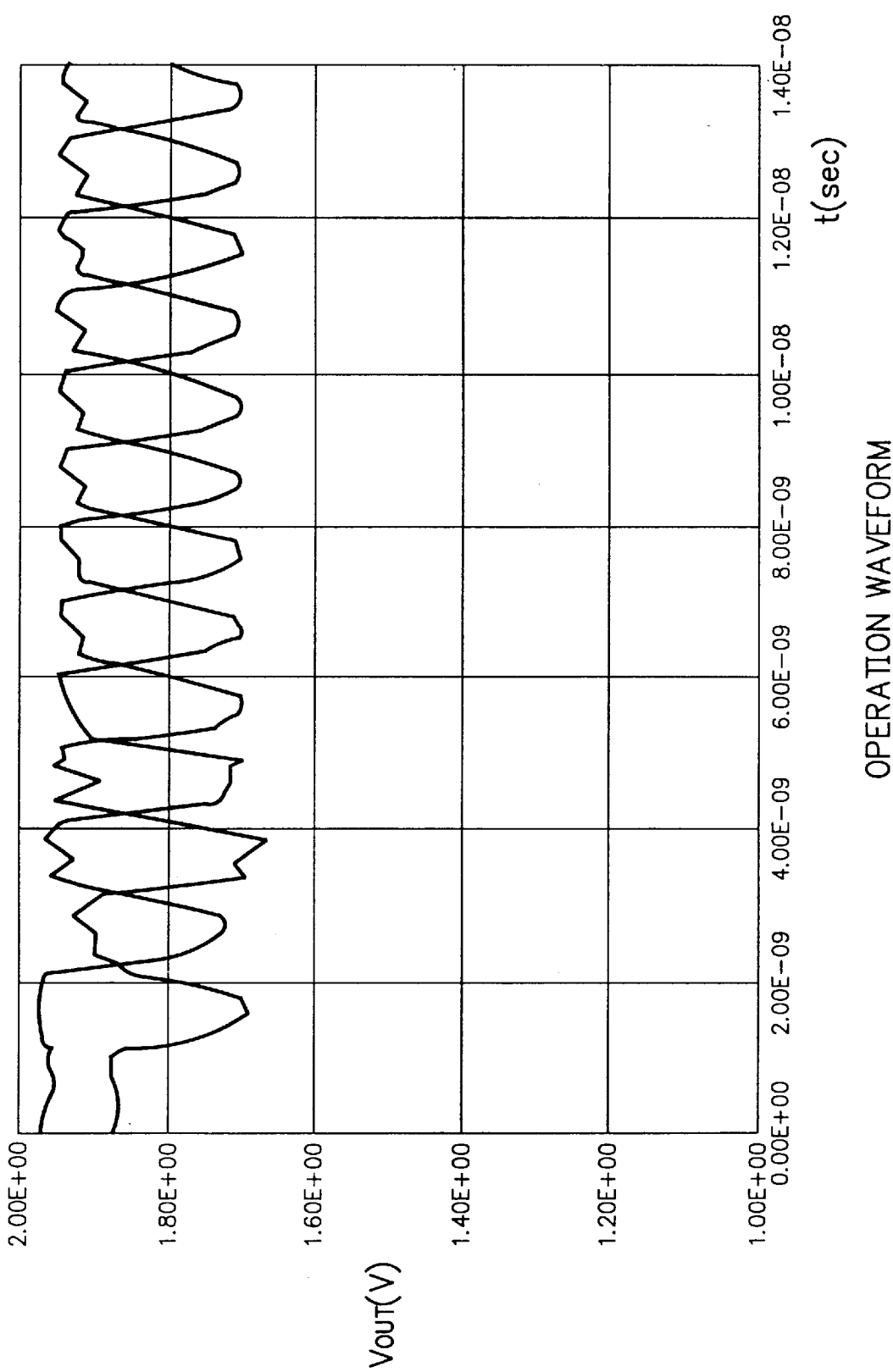

DIFFERENTIAL AMPLIFIER CIRCUIT

BACKGROUND OF THE INVENTION

The present invention relates to differential amplifier circuit. More to particularly, this invention relates to a differential amplifier circuit in which a high frequency signal more than several MHz is inputted thereto, and which is constituted such that at the time no-signal an output does not come into an intermediate electric potential.

DESCRIPTION OF THE PRIOR ART

FIGS. 1 and 2 show a conventional circuit configuration of a differential amplifier circuit described in Paul R. Gray, Robert G. Mayer, "Analysis and Design of Analog Integrated Circuit" Jhon Wiley & Sons, Inc.

A constitution and an operation of the conventional differential amplifier circuit shown in FIG. 1 are explained. Referring to FIG. 1, there are provided transistors Q1, Q2 whose both emitters are connected commonly, and which a non-inverting input and an inverting input are applied to bases thereof respectively, thus an inverting output and a non-inverting output are obtained from respective collectors thereof. While when an input is no-signal, namely when both the non-inverting input and the inverting input are fixed to the same electric potential, the output is fixed at an intermediate electric potential in between high level and low level.

Referring now to FIG. 2 of the accompanying drawings there are shown transistors Q1 and Q2 in which an emitter-resistor RE1 is connected to an emitter of the transistor Q1 and an emitter-resistor RE2 is connected to an emitter of the transistor Q2 and both emitter-resistors RE1 and RE2 are connected each other, and a non-inverting input and an inverting input are applied to respective bases of the transistor Q1 and Q2, thus an inverting out put and a non-inverting output are obtained from collectors respectively. The differential amplifier circuit of FIG. 2 has the same constitution as that of FIG. 1 unless the emitters are connected through the resistors. In regard to fundamental operation of the differential amplifier circuit of FIG. 2 is the same as that of FIG. 1 unless the voltage gain is small because the resistors are inserted into the emitters. Consequently, in this differential amplifier circuit of FIG. 2, when the input is fixed to the same electric potential, the output thereof is fixed to the intermediate electric potential.

Next, there is explained the case where an input is fixed to the same electric potential. Supposing that the differential amplifier circuit shown in FIGS. 1 or 2 is in use as an input amplifier of pre-scaler. A pre-scaler functions as frequency divider. The pre-scaler divides frequency of output of VCO (voltage controlled oscillator) of frequency synthesizer using PLL (Phase Locked Loop), thus resulting in low frequency state. An output frequency of the VCO, for example, when it is in use for local mobile communication, is degree of scores of MHz to several hundreds of MHz or 2 GHz.

Further, an output level is scores of mVpp to several hundreds of mvpp.

In order to amplify these signals, the same DC-bias should be given to an input of the differential amplifier circuit. As well as the AC signal from VCO through a capacitor is inputted from the non-inverting input, further, a smoothing capacitor is connected in between an inverting input and either the ground or a power source, thus resulting in non-signal state under AC mode.

Thus, DC electric potential of the non-inverting input and the inverting input becomes identical. The differential output is obtained in such a way that the AC signal is added to the non-inverting input. Consequently, when an output signal level of the VCO approximates to zero without limit or the output signal level of the VCO becomes non-signal state, an input of the differential amplifier circuit comes into identical level, as well as the output is fixed to intermediate electric potential.

In the differential amplifier circuit shown in FIGS. 1 and 2, it is capable of considering a way that it causes offset to supply to DC biases of both of the non-inverting input and the inverting input such that an output is not fixed to an intermediate electric potential at the time no-signal. However, in this case, the offset functions to an inputted AC signal too, sensitivity deteriorates to a small signal input.

As described-above, in the conventional differential amplifier circuit, when no AC signal is inputted to an amplifier circuit, a DC electric potential of input/output comes into intermediate electric potential. When this is inputted to the pre-scaler which uses a flip-flop consisting of differential circuit such as ECL (emitter coupled logic) and so forth, a clock input of differential device comes into intermediate electric potential, thus resulting in simultaneous latch state of both of master flip-flop and slave flip-flop so that there occurs so called data-through to induce self-oscillation.

Because, the conventional differential amplifier circuit is constituted such that when a differential input is same electric potential, an output comes into the same electric potential.

It is undesirable that an input sensitivity of the pre-scaler comes into the minimum state at the frequency no relation with the inputted signal on the constitution of radio communication device.

Further, in the case of differential amplifier circuit which supplies offset to an input, it is capable of avoiding that output comes into same electric potential at the time no-signal, however there is the problem that offset functions to the AC signal so that sensitivity of the differential amplifier circuit deteriorates.

SUMMARY OF THE INVENTION

In view of the foregoing, it is an object of the present invention to provide a differential amplifier circuit, at the time no-signal, namely when a differential input is fixed to the same electric potential, whose an out put does not come into intermediate electric potential, and the sensitivity of the differential amplifier circuit does not deteriorate to an AC signal.

In one arrangement to be described below by way of example in illustration of the invention, for achieving the above-mentioned object, a differential amplifier circuit includes a first pair of differential transistors into which AC signal is inputted, a second pair of differential transistors whose bases are connected to terminals existing in between both ends of respective load resistors of said first differential transistors, and a capacitor which enables by-pass of an AC signal to take place on the terminals existing in between both ends of the respective load resistors.

In one particular arrangement to be described in illustration of the present invention, by way of example, the differential amplifier circuit including a first and a second transistors whose collectors are connected to high electric potential side power source through a first and a second resistors respectively, and are connected to a first and a second terminals respectively, whose bases are connected to a first and a second input terminals respectively, and whose emitters which are connected each other are connected to low electric potential side power source through a first constant-current source, a third and a fourth transistors whose emitters which are connected each other are connected to low electric potential side power source through a second constant-current source, a first terminal to which both the base of the third transistor and the collector of the fourth transistor are connected existing in any point in between both ends of the first resistor, a second terminal to which both the base of the fourth transistor and the collector of the third transistor are connected existing in any point in between both ends of the second resistor, a first capacitor connected in between the first terminal and either the high electric potential side power source or the low electric potential side power source, and a second capacitor connected in between the second terminal and either the high electric potential side power source or the low electric potential side power source, wherein signal is inputted from the first and the second input terminals, and signal is outputted from the first and the second output terminals.

In another arrangement to be described below by way of example in illustration of the present invention, there is provided a differential amplifier circuit wherein one end of the first capacitor is connected to in between the first and the second terminals instead of in between the first terminal and either the high electric potential side power source or the low electric potential side power source.

In yet another arrangement to be described below by way of example in illustration of the present invention, there is provided the differential amplifier circuit, wherein the emitters of the first to the fourth transistors are connected mutually and are connected to the low electric potential side power source through the first constant-current source.

In yet another arrangement to be described below by way of example in illustration of the present invention, there is provided the differential amplifier circuit, wherein the bases of the first and the second transistors are connected to output of either differential circuit or multi-stages differential circuit more than two stages, and setting input of the differential circuit as the first and the second input terminals.

In yet another arrangement to be described below by way of example in illustration of the present invention, there is provided the differential amplifier circuit, wherein a third resistor is connected in between terminals of the high electric potential side of the first and the second resistors connected each other, and the high electric potential side power source.

In yet another arrangement to be described below by way of example in illustration of the present invention, there is provided a forming method of differential amplifier circuit comprising the steps of connecting a first and a second transistors whose collectors to high electric potential side power source through a first and a second resistors respectively, and to a first and a second terminals respectively, connecting bases of the fist and a second transistors to a first and a second input terminals respectively, and connecting emitters of the first and the second transistors which are connected each other to low electric potential side power source through a first constant-current source, connecting emitters of a third and a fourth transistors which emitters are connected each other to low electric potential side power source through a second constant-current source, existing a first terminal to which both the base of the third transistor and the collector of the fourth transistor are connected in any point in between both ends of the first resistor, existing a second terminal to which both the base of the fourth transistor and the collector of the third transistor are connected in any point in between both ends of the second resistor, connecting a first capacitor in between the first terminal and either the high electric potential side power source or the low electric potential side power source, and connecting a second capacitor in between the second terminal and either the high electric potential side power source or the low electric potential side power source, wherein signal is inputted from the first and the second input terminals, and signal is outputted from the first and the second output terminals.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

BRIEF DESCRIPTION OF THE DRAWINGS

FIG. 9 is a view showing a circuit operation wave form of the sixth embodiment according to the invention.

DETAILED DESCRIPTION OF THE PREFERRED EMBODIMENT

A preferred embodiment of the invention will be described in detail referring to accompanying drawings.

Figure 1:
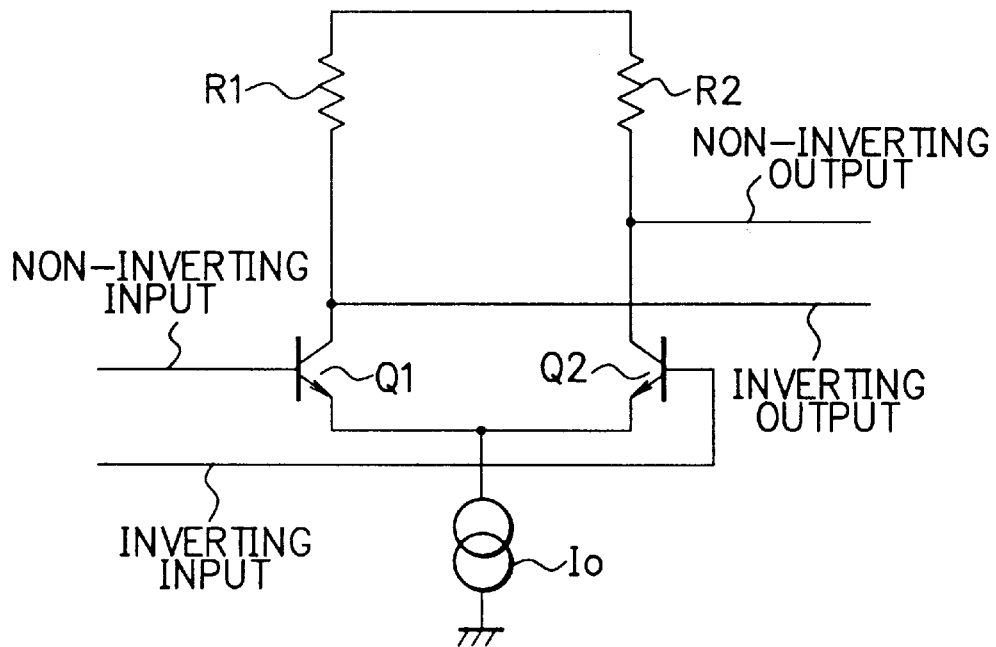
FIG. 1 is a view showing a conventional circuit configuration of a differential amplifier circuit.
Figure 2:
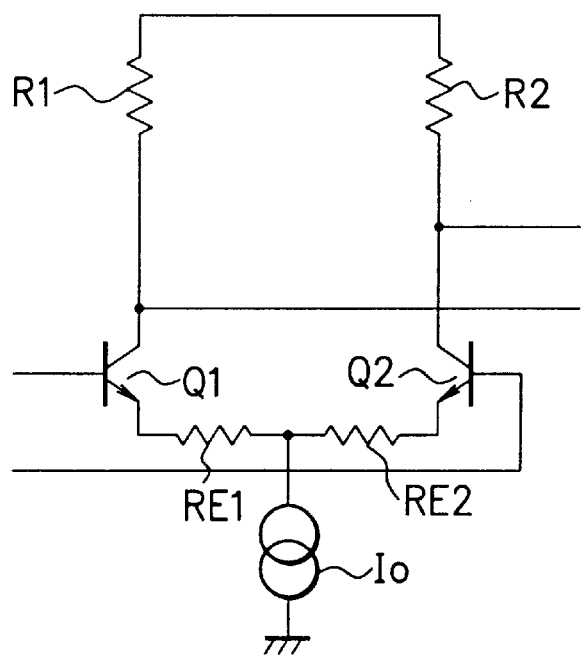
FIG. 2 is a view showing another conventional circuit constitution of the differential amplifier circuit.
Figure 3:
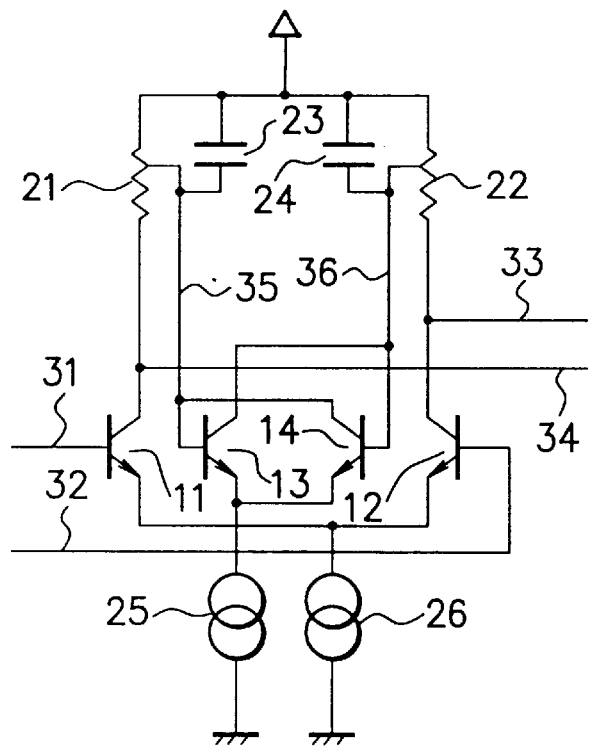
FIG. 3 is a view showing a circuit configuration of a first embodiment according to the present invention.

Referring now to FIG. 3 of the accompanying drawings, there is shown the differential amplifier circuit of the present invention, in the preferred embodiment, which includes a first pair of differential devices consisting of a first and a second transistors 11 and 12 to which the AC signal is inputted, a first and a second load resistors 21 and 22, and a constant current source 25, a second pair of differential devices consisting of a third and a fourth transistors 13 and 14 which are connected such that which enables positive feed back to take place from the terminals 35 and 36 in between both terminals in the first and the second load resistors 21 and 22, and capacitors 23 and 24 which causes by-pass of the AC signal of the first and the second terminals 35 and 36 to take place.

There is explained operation of the embodiment in which when AC input is no-signal, a current of the transistors 11 and 12 of the first pair of differential devices comes into equal. While, since the second pair of differential devices are constituted such that it causes positive feedback of direct current to take place, the current flowing on one side of transistors 13 and 14 becomes larger than that flowing the other side and this state is stabilized. Consequently, when the input is no-signal, the output does not remain at intermediate electric potential.

Further, concerning AC signal, which is not subjected to positive feedback due to operation of the by-pass capacitor, an input sensitivity is amplified without deterioration.

Concerning the embodiment according to the present invention described above, in order to explain in detail, an embodiment of the present invention will be explained referring to accompanying drawings.

EMBODIMENT 1

FIG. 3 is a view showing a constitution of one embodiment of the present invention. In FIG. 3, a differential amplifier circuit comprises transistors 11 and 12, resistors 21 and 22, and a constant current source 26, which uses the terminals 31 and 32 as inputs, and uses the terminals 33 and 34 as outputs. The pair of differential devices being composed of the transistors 13 and 14, and the constant-current source 25, in which bases and collectors of the transistors 13 and 14 are connected such that it causes positive feedback of signal from voluntary terminals existing in between both terminals of the load resistors 21 and 22 to take place. Smoothing capacitor for implementing by-pass of the AC signal is connected to the respective terminals 35 and 36 in between the terminals and the power source or in between the terminals and the ground.

Referring to FIG. 3, there is explained operation of the present embodiment. When the terminals 31 and 32 are the same electric potential, equivalent current flows at the transistors 11 and 12. When the pair of differential devices consisting of transistors 13 and 14 do not exists, output of the terminals 33 and 34 come into the same electric potential which is the same as that of the conventional differential amplifier circuit shown in FIG. 8.

In the present embodiment, as shown in FIG. 3, the pair of differential devices consisting of transistors 13 and 14 are connected such that it causes positive feedback of the output of the terminals 35 and 36 to implement. Consequently, at the initial state, when the current flowing through the transistor 13 is larger than the current flowing through the transistor 14, the electric potential of the terminal 36 becomes lower than the electric potential of the terminal 35 so that the pair of differential transistors is stabilized with the state where the current of the transistor 13 is large. Consequently, the electric potential of the output terminal 33 does not equal the electric potential of the output terminal 34, at this case, the electric potential of the output terminal 33 is lower than the electric potential of the output terminal 34. An electric potential difference thereof is determined by a load resistance of the pair of differential devices consisting of transistors 13 and 14, and a current value of the constant-current source 25. Here the current value of the constant-current source 25 is set as il, and both resistance values at the side of high electric potential of the resistors 21 and 22 which are divided by collector terminals 35 and 36 of the transistors 13 and 14 are set as R1, the electric potential difference of the terminals 33 and 34 equal the electric potential difference of the terminals 21 and 22, thus the value equals approximately il·R1. Conversely, in the initial state, when the current flowing at the transistor 14 is larger than the current flowing through the transistor 13, the electric potential of the output terminal 34 is lower than the electric potential of the output terminal 33, thus the pair of differential transistor is stabilized. While when the AC signal is inputted to the input terminals 31 and 32, the signals amplified by means of the pair of differential devices consisting of the transistors 31 and 32 are outputted from the output terminals 33 and 34.

At this time, the smoothing capacitors 23 and 24 are connected to the terminals 35 and 36, and by the fact that it causes value of these capacitors 23 and 24 to select suitably, the AC signal is not performed feed back to the transistors 13 and 14. Consequently, since feed back is not functioned to the AC signal, it operates as the differential amplifier circuit.

EMBODIMENT 2

Figure 4:
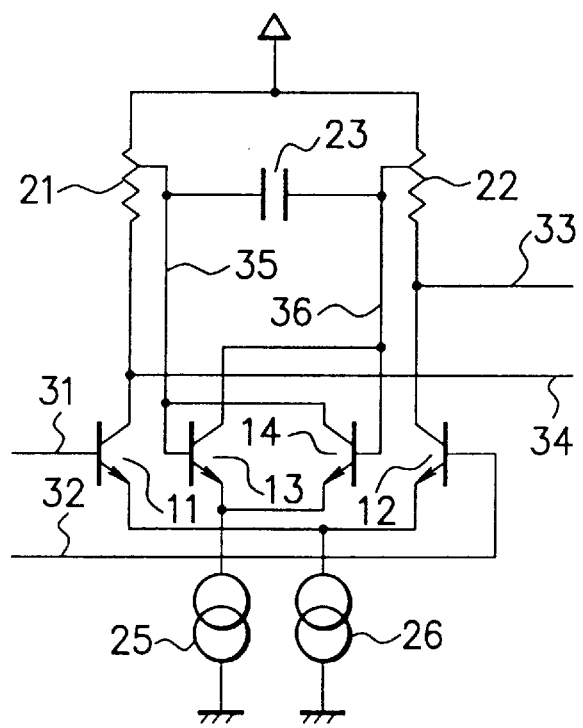
FIG. 4 is a view showing a circuit configuration of a second embodiment according to the present invention.

FIG. 4 is a view showing circuit configuration of a second embodiment of the present invention. Different point between the present embodiment and the above described the first embodiment is that the capacitor 23 is connected in between the terminals 35 and 36. When there is no capacitor in the differential amplifier circuit, the terminals 35 and 36 are inverted phase relation with each other. Thereby, as shown in FIG. 3, it is the same operation as that enables operation of capacitor in between power source and the terminal or in between ground and the terminal to take place.

EMBODIMENT 3

Figure 5:
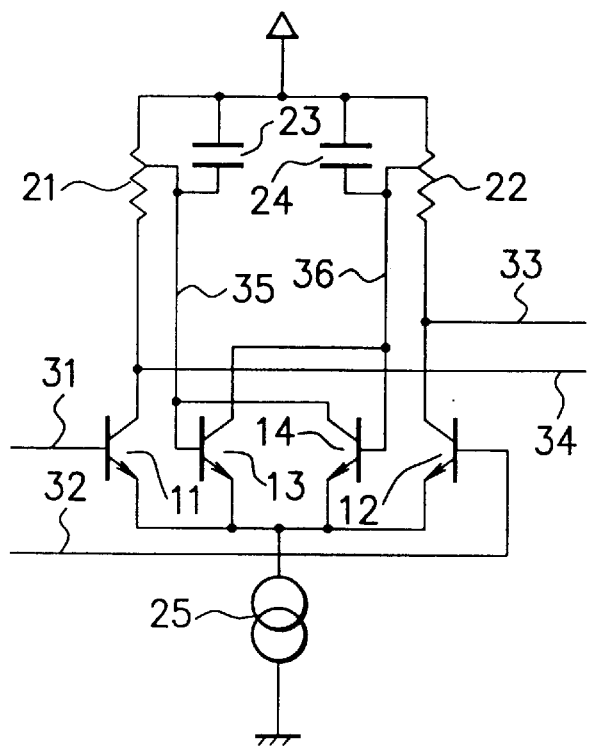
FIG. 5 is a view showing a circuit configuration of a third embodiment according to the present invention.

FIG. 5 is a view showing a circuit configuration of third embodiment of the present invention. Referring to FIG. 5, in the embodiment, emitters both of pair of differential devices consisting of the transistors 11 and 12 according to FIG. 3, and pair of differential transistors 13 and 14 are connected commonly to the constant-current source 25. Under this constitution, it is capable of setting such that when the input to the input terminals 31 and 32 is non-signal, the pair of differential device consisting of the transistors 13 and 14 have a force to compel, while when the signal is inputted to the input terminal 31 and 32, the pair of differential device consisting of transistors 11 and 12 have a force to compel.

EMBODIMENT 4

Figure 6:
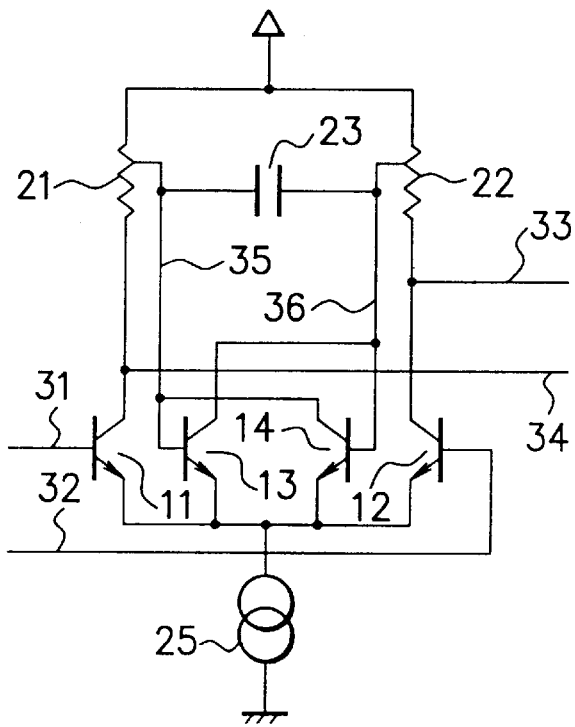
FIG. 6 is a view showing a circuit configuration of a fourth embodiment according to the present invention.

FIG. 6 is view showing circuit configuration of a fourth embodiment according to the present invention. Referring to FIG. 6, in the present embodiment, it causes capacitor to connect in between the terminals 35 and 36 shown in FIG. 5. Operation thereof is the same as that of the above-described EMBODIMENT 3.

EMBODIMENT 5

Figure 7:
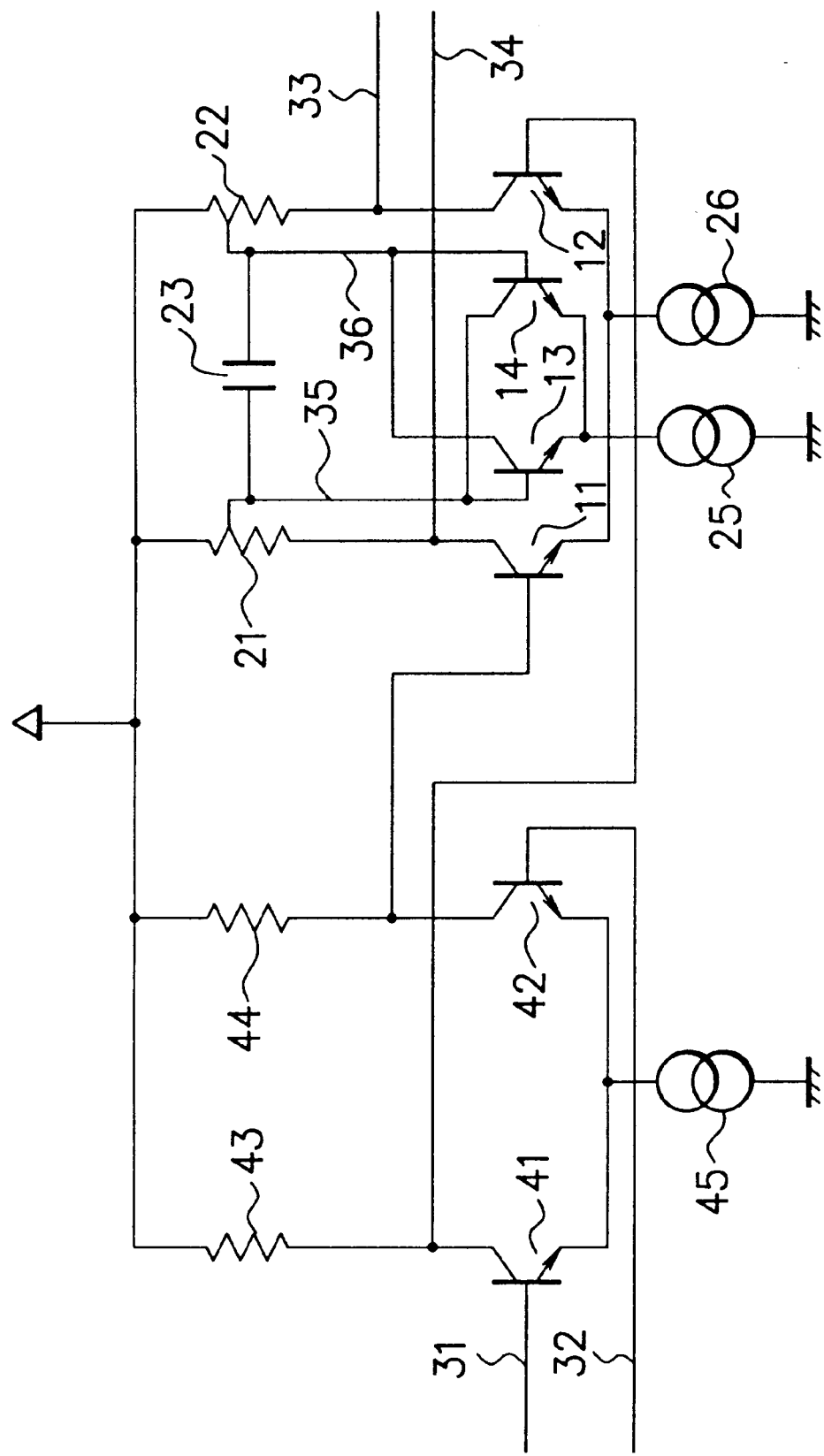
FIG. 7 is a view showing a circuit configuration of a fifth embodiment according to the present invention.

FIG. 7 is a view showing a circuit configuration of a fifth embodiment of the present invention. Referring to FIG. 7, the present embodiment is constituted in such a way that it causes a differential amplifier circuit consisting of transistors 41 and 42, load resistors 43 and 44, and a constant-current source to provide by way of one stage at front stage of the differential amplifier circuit shown in FIG. 3, thus operation thereof is the same as that of FIG. 3.

EMBODIMENT 6

Figure 8:
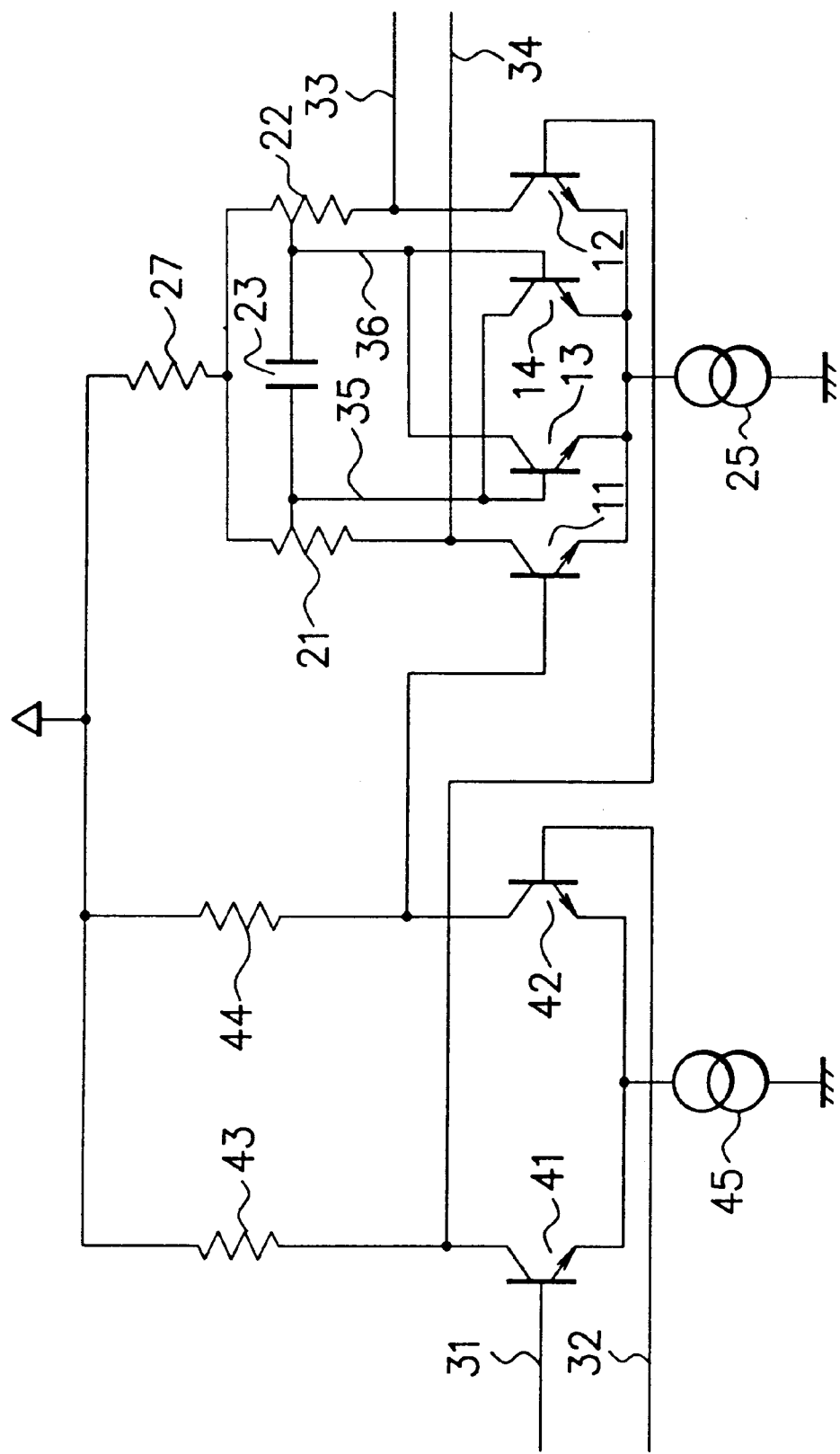
FIG. 8 is a view showing a circuit configuration of a sixth embodiment according to the present invention.

FIG. 8 is a view showing a circuit configuration of a sixth embodiment of the present invention. Referring to FIG. 8, the present embodiment is constituted in such a way that it causes a differential amplifier circuit consisting of transistors 41 and 42, load resistors 43 and 44, and a constant current source to provide by way of one stage at front stage of the differential amplifier circuit shown in FIG. 5, thus operation thereof is the same as that of FIG. 5.

Further in FIG. 8, a resistor 27 functions, when the AC signal is inputted, such that it causes force to compel of precedent of output of the front amplifier circuit to enhance.

FIG. 9 is a operation wave form of the differential amplifier circuit of the sixth embodiment shown in FIG. 8. A power source voltage is set as 2V, an input is set as non signal state from Ons (nano sec) to 1 ns, after 1 ns, signal of amplitude to be 0.2 Vpp, frequency to be 500 MHz is inputted. An output wave form of the case has been indicated in FIG. 9. When the input signal is no-signal, the outputs are degrees of 1.97 V and 1.88 V, thus the outputs being stabilized. When sinusoidal wave of 500 MHz is inputted, the output is not stabilized instantaneously caused by existing of smoothing capacitor, however in this case, after 6 ns, an amplification output except for offset is obtained.

As described-above, according to the present invention, when the differential amplifier circuit of the invention is in use as an input amplifier of pre-scaler, at the time no-signal, it is capable of preventing self-oscillation caused by data-through of the pre-scaler.

Because, in the present invention, at the time no-signal, the output is not stabilized at the intermediate electric potential, the non-inverting output and the inverting output are stabilized either at high level or low level, due to this operation, when the differential amplifier circuit of the present invention is in use for a flip-flop of the pre-scaler connected to clock input, thus data-through does not occur.

The device, like Schmidt circuit, in which the differential amplifier circuit of the invention is in use results in non-deterioration of input sensitivity.

Because, in the present invention, the DC signal is subjected to a positive feedback, while concerning the AC signal, feedback quantity comes to be lessened due to by-pass capacitor.

While particular embodiments illustrative of the invention have been described by way of example, it will be understood that variations and modifications thereof, as well as other embodiments, may be conceived within the scope of the following claims.

What is claimed is:

1. A differential amplifier circuit comprising:
   a first pair of differential transistors whose collectors are connected to high electric potential side power source through resistors respectively, and are connected to output terminals respectively, and whose bases are connected to input terminals respectively into which AC signal is inputted;
   a second pair of differential transistors whose bases are connected to terminals existing in between both ends of respective load resistors of said first differential transistors, and whose collectors are connected to said bases in such a way that a collector of one transistor of said second pair of differential transistors is connected to a base of the other transistor of said second pair of differential transistors, and vice versa; and
   a capacitor which enables by-pass of an AC signal to take place on said terminals existing in between both ends of said respective load resistors.

2. A differential amplifier circuit comprising:
   a first and a second transistors whose collectors are connected to high electric potential side power source through a first and a second resistors respectively, and are connected to a first and a second output terminals respectively, whose bases are connected to a first and a second input terminals respectively, and whose emitters which are connected each other are connected to low electric potential side power source through a first constant-current source;
   a third and a fourth transistors whose emitters which are connected each other are connected to low electric potential side power source through a second constant-current source;
   a first terminal to which both said base of said third transistor and said collector of said fourth transistor are connected, existing in any point in between both ends of said first resistor;
   a second terminal to which both said base of said fourth transistor and said collector of said third transistor are connected, existing in any point in between both ends of said second resistor;
   a first capacitor connected in between said first terminal and either said high electric potential side power source or said low electric potential side power source; and
   a second capacitor connected in between said second terminal and either said high electric potential side power source or said low electric potential side power source,
   wherein signal is inputted from said first and said second input terminals, and signal is outputted from said first and said second output terminals.

3. A differential amplifier circuit as claimed in claim 2, wherein one end of said first capacitor is connected to in between said first and said second terminals instead of in between said first terminal and either said high electric potential side power source or said low electric potential side power source.

4. A differential amplifier circuit as claimed in claim 2, wherein the emitters of said first to said fourth transistors are connected mutually and are connected to said low electric potential side power source through said first constant-current source.

5. A differential amplifier circuit as claimed in claim 4, wherein one end of said first capacitor is connected to in between said first and said second terminals instead of in between said first terminal and either said high electric potential side power source or said low electric potential side power source.

6. A differential amplifier circuit as claimed in claim 2, wherein said bases of said first and said second transistors are connected to output of either differential circuit or multi-stages differential circuit more than two stages, and setting input of said differential circuit as said first and said second input terminals.

7. A differential amplifier circuit as claimed in claim 6, wherein a third resistor is connected in between terminals of said high electric potential side of said first and said second resistors connected each other, and said high electric potential side power source.

8. A differential amplifier circuit as claimed in claim 7, wherein an output of DC bias supply means is connected to said first and said second input terminals, and AC signal is inputted from one side of said first and said second terminals through a capacitor.

9. A forming method of differential amplifier circuit comprising the steps of:
   connecting a first and a second transistors whose collectors to high electric potential side power source through a first and a second resistors respectively, and to a first and a second terminals respectively, connecting bases of said fist and a second transistors to a first and a second input terminals respectively, and connecting emitters of said first and said second transistors which are connected each other to low electric potential side power source through a first constant-current source;
   connecting emitters of a third and a fourth transistors which emitters are connected each other to low electric potential side power source through a second constant-current source;
   existing a first terminal to which both said base of said third transistor and said collector of said fourth transistor are connected in any point in between both ends of said first resistor;

existing a second terminal to which both said base of said fourth transistor and said collector of said third transistor are connected in any point in between both ends of said second resistor;

connecting a first capacitor in between said first terminal and either said high electric potential side power source or said low electric potential side power source; and connecting a second capacitor in between said second terminal and either said high electric potential side power source or said low electric potential side power source, wherein signal is inputted from said first and said second input terminals, and signal is outputted from said first and said second output terminals.

* * * * *